(12) United States Patent
Kuehner

(10) Patent No.: US 9,024,697 B2
(45) Date of Patent: May 5, 2015

(54) METHOD FOR OPERATING CONTROL EQUIPMENT OF A RESONANCE CIRCUIT AND CONTROL EQUIPMENT

(75) Inventor: Jochen Kuehner, Backnang (DE)

(73) Assignee: Robert Bosch GmbH, Stuttgart (DE)

( * ) Notice: Subject to any disclaimer, the term of this patent is extended or adjusted under 35 U.S.C. 154(b) by 138 days.

(21) Appl. No.: 13/805,713

(22) PCT Filed: Jun. 15, 2011

(86) PCT No.: PCT/EP2011/059967
§ 371 (c)(1),
(2), (4) Date: Dec. 20, 2012

(87) PCT Pub. No.: WO2011/160993
PCT Pub. Date: Dec. 29, 2011

(65) Prior Publication Data
US 2013/0093528 A1 Apr. 18, 2013

(30) Foreign Application Priority Data
Jun. 22, 2010 (DE) .......................... 10 2010 030 328

(51) Int. Cl.
  H03J 5/24 (2006.01)
  H03B 5/32 (2006.01)
  H02M 3/337 (2006.01)
  H02N 2/00 (2006.01)
  H02M 1/00 (2006.01)

(52) U.S. Cl.
  CPC .............. *H03B 5/32* (2013.01); *H02M 3/3376* (2013.01); *H02N 2/008* (2013.01); *H03J 5/24* (2013.01); *H02M 2001/0058* (2013.01); *Y02B 70/1491* (2013.01)

(58) Field of Classification Search
USPC ......... 331/111, 143, 144, 145, 153, 154, 155, 331/185, 186; 323/225, 284; 363/71
See application file for complete search history.

(56) References Cited

U.S. PATENT DOCUMENTS

| 4,939,402 A | 7/1990 | Hirayama et al. |
| 5,642,065 A | 6/1997 | Choi et al. |
| 8,212,543 B2 * | 7/2012 | Kenly et al. ................... 323/285 |
| 2004/0066178 A1 | 4/2004 | Mizoguchi et al. |

(Continued)

FOREIGN PATENT DOCUMENTS

| DE | 102005010927 | 11/2006 |
| EP | 1124317 | 8/2001 |

(Continued)

OTHER PUBLICATIONS

International Search Report for Application No. PCT/EP2011/059967 dated Oct. 14, 2011 (3 pages).

*Primary Examiner* — Joseph Chang
*Assistant Examiner* — Jeffrey Shin
(74) *Attorney, Agent, or Firm* — Michael Best & Friedrich LLP

(57) ABSTRACT

The invention relates to a method for operating control equipment (1) of a resonance circuit (2), wherein the control equipment (1) comprises at least two circuit elements (8, 9) connected in series, in particular each comprising a recovery diode (13, 14) connected in parallel, between which a connection (6) of the resonance circuit (2) is connected. According to the invention, the circuit elements (8, 9) are actuated as a function of the voltage detected at the connection (6). The invention further relates to control equipment (1) of a resonance circuit (2).

11 Claims, 4 Drawing Sheets

(56) References Cited

U.S. PATENT DOCUMENTS

| | | | |
|---|---|---|---|
| 2004/0228153 A1* | 11/2004 | Cao et al. | 363/71 |
| 2006/0125454 A1 | 6/2006 | Chen et al. | |
| 2006/0291117 A1 | 12/2006 | Kyono | |
| 2009/0230930 A1* | 9/2009 | Jain et al. | 323/234 |
| 2010/0118565 A1 | 5/2010 | Stuler | |
| 2010/0148590 A1 | 6/2010 | Kojima | |
| 2011/0205761 A1* | 8/2011 | Tschirhart et al. | 363/21.02 |

FOREIGN PATENT DOCUMENTS

| | | |
|---|---|---|
| JP | 05143168 | 6/1993 |
| JP | 2009112123 | 5/2009 |
| TW | 259345 | 8/2006 |
| WO | 2006022365 | 3/2006 |

* cited by examiner

METHOD FOR OPERATING CONTROL EQUIPMENT OF A RESONANCE CIRCUIT AND CONTROL EQUIPMENT

BACKGROUND OF THE INVENTION

The invention relates to a method for operating control equipment of a resonance circuit, wherein the control equipment comprises at least two circuit elements connected in series, in particular each comprising a recovery diode connected in parallel, between which a connection of the resonance circuit is connected. The invention further relates to control equipment of a resonance circuit.

Methods of the aforementioned type are known from the prior art. The resonance circuit is, for example, an electrical or an electromechanical resonance circuit. The resonance circuit can also be referred to as an oscillating circuit. Said circuit usually consists of at least one capacitive element (capacitor) as well as at least one inductive element (coil). The oscillating circuit is therefore a resonant electrical circuit, which can execute electrical oscillations. In the case of an LC oscillating circuit consisting of coil and capacitor, energy is periodically exchanged between the magnetic field of the coil and the electrical field of the capacitor, whereby high amperage or high voltage is alternately present.

The control equipment is associated with the resonance circuit, the former serves to activate the resonance circuit, preferably at the resonance frequency thereof. In so doing, the control equipment comprises the at least two circuit elements, which are preferably connected in series. A recovery diode is advantageously connected in parallel to each of the circuit elements. The connection of the resonance circuit is provided between the circuit elements connected in series. By means of the circuit elements, which can also be referred to as actuating elements, a frequency is predetermined for the resonance circuit. Said frequency preferably coincides with the resonance frequency of the resonance circuit. In order to set the actuation frequency, with which the circuit elements for actuating the resonance circuit are operated, a choke voltage and a choke current are usually measured. The choke voltage and the choke current thereby correspond to the voltage which drops across the inductive element and to the current which passes through the inductive element. Provision is however at least made to determine the choke current in order carry out the resonance control of the resonance circuit using the control equipment.

It is however thereby necessary to provide sensors in order to determine the choke current and possibly additionally the choke voltage. In addition, a device must be provided to evaluate the signals acquired by means of the sensors and on the basis of this evaluation to carry out a resonance control. When processing the signals, the so-called differential phase determination is frequently used. The determination of the choke voltage or the choke current is however complicated and the sensors necessary for said determination are costly.

SUMMARY OF THE INVENTION

In contrast, the method for operating control equipment of the resonance circuit has the advantage that the control equipment can be operated without the previously described sensors for determining the choke voltage or the choke current. According to the invention, this is achieved by the circuit elements being actuated as a function of a voltage detected at the connection of the resonance circuit. Neither sensors for determining the choke voltage nor sensors for determining the choke current are therefore necessary. In fact, only the voltage between the circuit elements or at the connection of the resonance circuit is to be detected. On the basis of said voltage, the circuit elements can be reliably actuated. The voltage is thereby a measurement for the instantaneous flowing choke current, in particular if all circuit elements are open, is however considerably simpler to determine than said choke current. The two circuit elements form a half bridge comprising a center tap disposed by means of circuitry between said elements, the connection of the resonance circuit being connected to said center tap. The circuit elements can, for example, be power electronic actuating elements. The voltage detected at the connection is, for example, determined in relation to a further connection of the resonance circuit. The determination of the voltage can thus take place between the two connections of the resonance circuit, preferably in parallel with one of the circuit elements or the recovery diode associated therewith.

A modification to the invention provides that the circuit elements for activating the resonance circuit are periodically opened and closed, wherein the voltage is only then detected at the connection if the circuit elements are open. The circuit elements are periodically opened and closed in a manner known per se in order to operate the control equipment or to excite the resonance circuit. Because the circuit elements are connected in series, said elements may not be closed at the same time, i.e. electrically conductive, in order to prevent a short circuit in the control equipment. Because switch-on and or switch-off delays of the circuit elements usually occur in practice, said circuit elements are actuated having locking times or dead times. Due to said locking or dead times, a time period results, in which none of the circuit elements are closed, or respectively conduct current. In this time period, the current is led through at least one of the recovery diodes. Provision is now made for the voltage to be detected at the connection while the circuit elements, or respectively all circuit elements, are open. The voltage of the center tap of the half bridge formed by the circuit elements is therefore detected. It can be determined from this voltage if the current actuation frequency, with which the circuit elements of the control equipment are actuated, is located above or below the resonance frequency. With this information, the actuation frequency can be controlled in an open-loop or closed-loop manner so that the resonance circuit is constantly operated at the resonance frequency thereof.

A modification to the invention provides for the detected voltage to be supplied to a comparator, in particular to a Schmitt trigger, in order to be converted into a digital signal. As previously described, the current flows across a recovery diode in the time period, in which the circuit elements are open. When the current is positive, said positive current flows thereby through one of the recovery diodes; and when the current is negative, said negative current flows through the other of the two recovery diodes. The result is that the voltage detected at the connection, for example in the case of positive current, returns to zero and in the case of negative current corresponds to a supply voltage. The difference between the detected voltage when the current is positive and the detected voltage when the current is negative corresponds to the amount of supply voltage. The detected voltage is a function of the current direction. In order to produce the digital signal from the voltage, said voltage is supplied to the comparator. The comparator thereby compares the detected voltage preferably with a voltage, which is greater than the minimum voltage to be expected and less than the maximum voltage to be expected. In this way, faults, which, for example, are caused by the forward voltage of the recovery diodes, can be filtered out. The comparator is preferably a Schmitt trigger. If the circuit elements are open, then the digital signal consequently indicates the polarity of the choke current. On the basis of said polarity, the circuit elements can now be actuated in such a way that the resonance circuit is operated at the resonance frequency thereof.

Provision is made in a modification to the invention for the digital signal to be used as the input signal for a flip-flop and/or a counter. The digital signal can be made temporally stable. For this purpose, the flip-flop is actuated with a specified scanning frequency. Provision is additionally or alternatively made for the counter. A new actuation frequency can be determined from the digital signal with the counter. The control equipment has now to be operated with said new actuation frequency instead of with the actuation frequency used up until now; or the circuit elements have to be actuated with said new actuation frequency instead of the actuation frequency used up until now in order to operate the resonance circuit at the resonance frequency thereof or at least closer to said resonance frequency than is the case with said actuation frequency currently being used. The new actuation frequency is consequently determined with the counter, which actuation frequency is subsequently used to operate the control equipment instead of the actuation frequency used up until now. In an especially preferred manner, the digital signal is supplied to the flip-flop and the counter is hooked up to an output of the flip-flop. In this way, an extremely robust operation of the control equipment is achieved.

Provision is made in a modification to the invention for a controller of the control equipment to actuate the circuit elements with a specified frequency, in particular specified by means of the counter. To meet this end, the controller is intended to actuate the circuit elements such that the latter either assume the open or the closed state thereof. In so doing, the actuation takes place in such a way that the circuit elements are alternately or periodically opened and closed; however, are never simultaneously closed in order to prevent the short circuit in the control equipment, which was previously described. The actuation of the circuit elements thereby occurs with the specified (actuation) frequency. The specified frequency is preferably determined using the counter.

Provision is made in a modification to the invention for a clock signal to be supplied from the controller to the flip-flop and/or the counter. In so doing, the clock signal of the flip-flop is different from the clock signal of the counter. The controller preferably transmits the clock signal to the flip-flop if the voltage at the connection of the resonance circuit is to be detected, thus the circuit elements are open. In contrast, the clock signal supplied to the counter preferably has a constant frequency.

Provision is made in a modification to the invention for the detection of the voltage to be effected by the clock signal supplied to the flip-flop. As previously described, the clock signal is supplied by the controller to the flip-flop if the voltage is to be detected at the connection of the resonance circuit. This is usually the case if the circuit elements are open.

Provision is made in a modification to the invention for the resonance circuit to be used for contactless power transmission or for the actuation of a piezoelectric oscillator. In this way, cost effective devices can be implemented for contactless power transmission or for the actuation of the piezoelectric oscillator.

The invention further relates to control equipment of a resonance circuit, in particular for carrying out the previously described method, comprising at least two circuit elements connected in series, in particular each comprising a recovery diode connected in parallel, between which a connection of the resonance circuit is connected. The invention thereby provides that the control equipment is designed for the purpose of actuating the circuit elements as a function of a voltage detected at the connection of the resonance circuit.

In addition, the invention is as it were focused on a device for contactless power transmission and a device for actuating a piezoelectric oscillator. Said devices each comprise the previously described control equipment and/or are provided for carrying out the previously described method.

BRIEF DESCRIPTION OF THE DRAWINGS

The invention is described below in detail with the aid of the examples of embodiment depicted in the drawings, without any limitation being placed on the invention. In the drawings.

DETAILED DESCRIPTION

Figure 1:
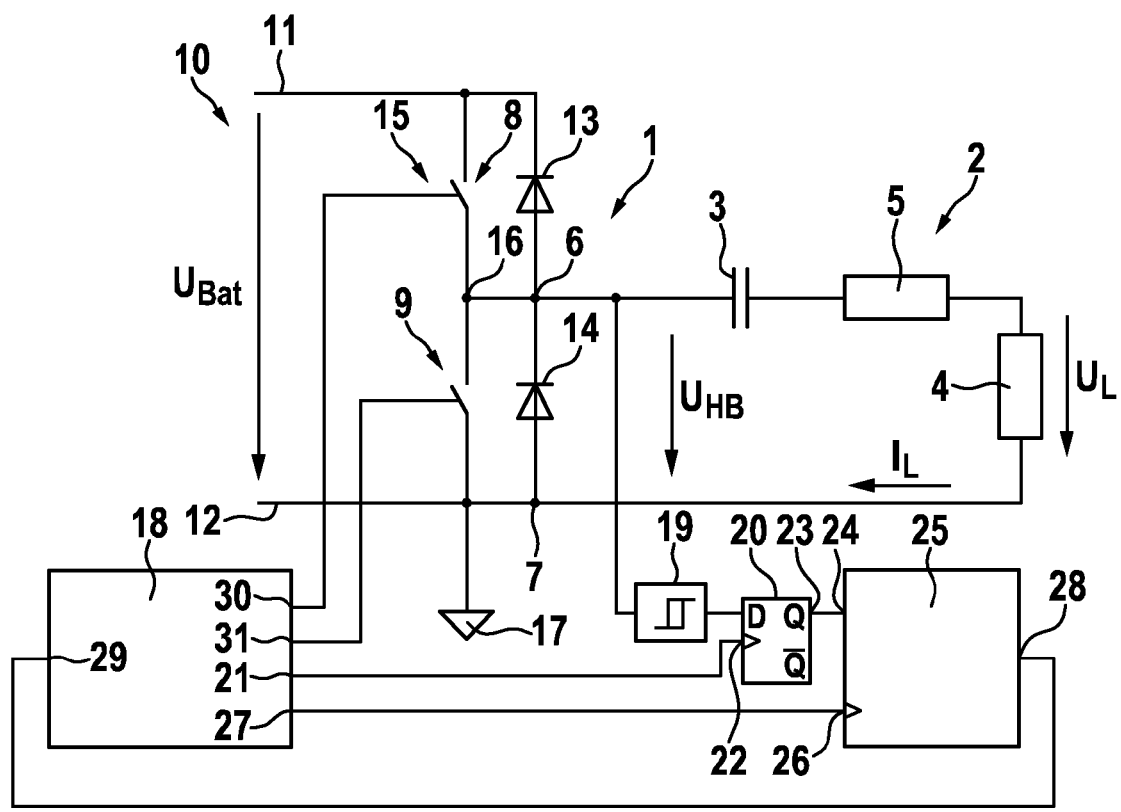
FIG. 1 shows a schematic circuit diagram of control equipment and a resonance circuit, with which a method for operating said control equipment can be implemented.

FIG. 1 shows a circuit diagram, in which control equipment 1 and a resonance circuit 2 are depicted. The control equipment 1 serves thereby to actuate or respectively excite the resonance circuit 2.

In the exemplary embodiment depicted here, the resonance circuit 2 comprises a capacitor 3, a coil 4 and a (optional) resistor 5. The capacitor 3, the coil 4 and the resistor 5 are connected in series. The resonance circuit 2 comprises a first connection 6 and a second connection 7. In the present exemplary embodiment, both connections 6 and 7 are connected to the control equipment 1.

The control equipment 1 comprises two circuit elements 8 and 9, which are jointly connected in series to a power supply device 10 (which is not depicted here in detail). The power supply device 10 provides a supply voltage $U_{Bat}$ between poles 11 and 12. The series connection of the two circuit elements 8 and 9 is thereby provided between the two poles 11 and 12 of the power transmission device 10. The circuit element 8 is associated with the pole 11 and the circuit element 9 is associated with the pole 12 or respectively in each case directly connected to said poles. The circuit elements 8 and 9 comprise in each case a recovery diode 13 or 14. Said circuit elements 8 and 9 form in this respect a half bridge 15 comprising a center tap 16, which is situated between the circuit elements 8 and 9. The first connection of the resonance circuit 2 is now connected to said center tap 16, whereas the second connection is connected to the pole 12 of the power supply device 10. The resonance circuit 2 is thus present parallel to the circuit element 9 or to the recovery diode 14. The pole 11 of the power supply device 10 has, for example, a positive potential, whereas the pole 12 corresponds to a ground as is indicated by the symbol 17. The circuit elements 8 and 9 are, for example, power electronic actuating elements.

The circuit elements 8 and 9 are actuated in each case to open or close with an actuation frequency provided by a controller 18 of the control equipment 1. The circuit elements 8 and 9 are thus periodically opened and closed. In this way, an activation of the resonance circuit 2 takes place. The actuation frequency is specified to the resonance circuit 2 by the circuit elements 8 and 9. In order to efficiently operate said resonance circuit 2, the actuation frequency has to at least approximately coincide with the resonance frequency of said resonance circuit 2. The resonance frequency is thereby dependent on various features of said resonance circuit 2, for example the capacity of the capacitor 3 and the inductance of the coil 4. In order to control the actuation frequency of the circuit elements 8 and 9, it is known from the prior art to measure the choke voltage $U_L$ and the choke current $I_L$ and to perform the control on the basis of the phase shift between choke voltage $U_L$ and choke current $I_L$.

According to the invention, provision is made for a voltage $U_{HB}$ to be detected at the connection 6 or at the center tap 16 and for the circuit elements 8 and 9 to be actuated as a function of said detected voltage $U_{HB}$. The sensors usually used for determining the choke voltage $U_L$ and choke current $I_L$ are therefore eliminated. For this purpose, the first connection 6 or the center tap 16 is connected to a comparator 19, which is embodied in this case as a Schmitt trigger. The detected voltage $U_{HB}$ thus serves as the input signal for the comparator 19. An output signal of comparator 19 is supplied to a flip-flop 20. In addition, a clock signal from the controller 18 is supplied to the flip-flop 20. For that purpose, a clock signal output 21 of the controller 18 is connected to a clock signal input 22 of the flip-flop 20. An output 23 of the flip-flop 20 is connected to an input 24 of a counter 25. A clock signal, which the controller 18 emits at a clock signal output 27, is additionally supplied to the counter 25 at a clock signal input 27. The counter 25 comprises a frequency signal output 28 which is connected to a frequency signal input 29 of the controller 18. Said controller 18 further comprises a first control output 30 and a second control output 31, wherein the circuit element 8 is connected to the first control output 30 and the control element 9 is connected to the second control output 31. The controller 18 causes the circuit elements 8 and 9 to open or close via the control outputs 30 and 31.

The following function results for the control equipment 1 and the resonance circuit 2: the circuit elements 8 and 9 are periodically opened and closed by means of the controller 18, wherein this action takes place with an actuation frequency. For this reason, an oscillation of the resonance circuit 2 is induced in a manner known per se. In order to avoid a short circuit between the poles 11 and 12 despite the time required to carry out a switching operation of the circuit elements 8 and 9, locking times or dead times are provided, in which the circuit elements 8 and 9 are simultaneously opened. The actuation of the circuit elements 8 and 9 thus occurs in such a way that the circuit element 8 is, for example, initially closed. If said circuit element 8 is now to be opened and the circuit element 9 is now to be closed, said circuit element 8 is then initially opened and only after a predefined period of time, i.e. the locking time or dead time, is said circuit element 9 actuated to close by the controller 18. Hence, the case can never occur, where said circuit elements 8 and 9 are simultaneously closed. A short circuit between the poles 11 and 12 of the power supply device 10 is therefore effectively prevented.

While the circuit elements 8 and 9 are open, the current is led through the recovery diode 13 or 14. If the current that is currently present in the resonance circuit 2 is positive, said current then flows through the recovery diode 14. If the current is negative, said current flows through the recovery diode 13. The result is that the detected voltage $U_{HB}$ (disregarding the diode forward voltage) returns to zero when the current is positive and in the case of negative current corresponds to the supply voltage $U_{Bat}$. The voltage level difference therefore corresponds to the amount of supply voltage $U_{Bat}$. The voltage $U_{HB}$ can thus be detected at the first connection 6 or at the center tap 16, said voltage $U_{HB}$ as a function of the current direction being either $U_{Bat}$ or zero.

The voltage $U_{HB}$ is converted into a digital signal with the aid of the comparator 19. In so doing, said voltage $U_{HB}$ is compared by the comparator 19 with a predefined, usually constant reference voltage, which is preferably greater than zero; however, smaller than the supply voltage $U_{Bat}$. The digital signal thus indicates—if the circuit elements 8 and 9 are open—the polarity of the choke current $I_L$. The detection of the voltage $U_{HB}$ occurs if a clock signal is supplied via the clock signal input 22 to the flip-flop 20 downstream of the comparator 19. The feed of the clock signal takes place thereby by means of the controller 18 if the circuit elements 8 and 9 are both open. The flip-flop 20 thus provides a temporarily stable digital signal, which corresponds to the voltage $U_{HB}$ which was last detected. Said signal is supplied to the input 24 of the counter 27. At the same time, a further clock signal, which preferably has a constant frequency, is applied to the counter 25, preferably by the controller 18. If the digital signal present at the input 24 is set, the detected voltage $U_{HB}$ being then positive or the choke current $I_L$ being negative, the counter 25 thus increments a value in each clock cycle.

The resulting value is—preferably prior to or during the next detection of the voltage $U_{HB}$—provided via the frequency signal output 28 to the frequency signal input 29 of the controller 18, and the counter 25 is preferably reset. From the value conveyed by the counter, the controller 18 determines a new actuation frequency for the circuit elements 8 and 9 or the information whether the current actuation frequency lies above or below the resonance frequency. In the latter case, the new actuation frequency is reduced or increased on the basis of the current actuation frequency, preferably by a predetermined value or by a value determined from at least the current actuation frequency. The new actuation frequency is used instead of the previous actuation frequency until the counter 25 once again delivers a value. In this way, the controller 18 adjusts itself in the manner of an open-loop or closed-loop control to the resonance circuit 2 such that the actuation frequency is successively matched to the resonance frequency of the resonance circuit 2. In this way, the actuation frequency can be matched to the resonance frequency without the immediate determination of the choke voltage $U_L$ and the choke current $I_L$ being necessary. A cost effective open-loop or closed-loop control of the control equipment can therefore be achieved.

Figure 2:
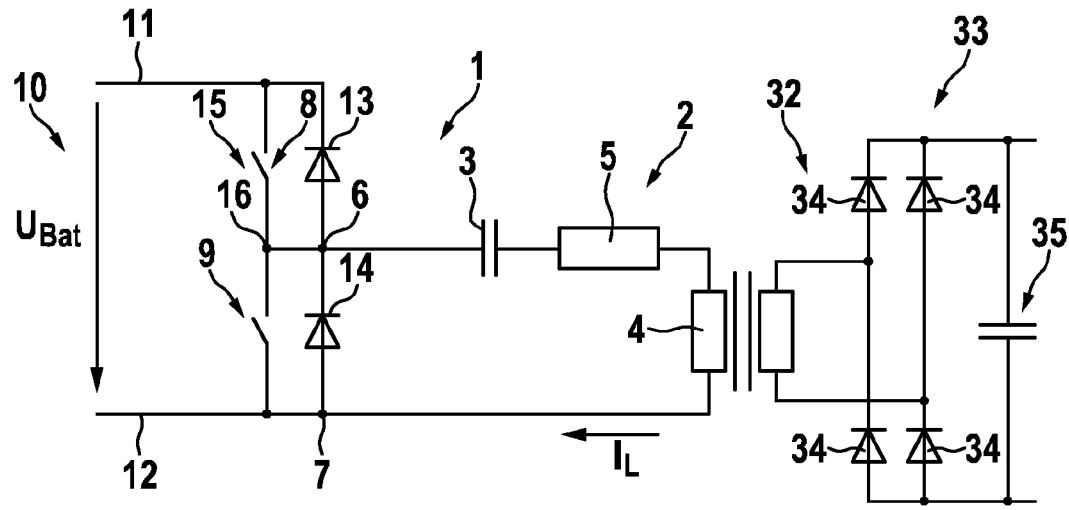
FIG. 2 shows a schematic circuit diagram, wherein the resonance circuit for contactless power transmission is used.

FIG. 2 shows a schematic circuit diagram, in which the use of the circuit from FIG. 1 for contactless power transmission, in particular for charging a hand-held power tool, is shown. In this connection, an additional resonance circuit 32 is associated with the resonance circuit 2, which in this case is, for example, associated with a charging station. The additional resonance circuit 32 consists only of a coil in the case dealt with here. Said additional resonance circuit 32 is connected to a rectifier circuit 33 consisting of four diodes. In addition, a smoothing device 35, in particular in the form of a capacitor, is provided. The schematic circuit diagram of FIG. 2 is simplified and thus, for example, the control equipment 1 is not completely depicted. In this respect, further details can be obtained from the description pursuant to FIG. 1.

Figure 3:
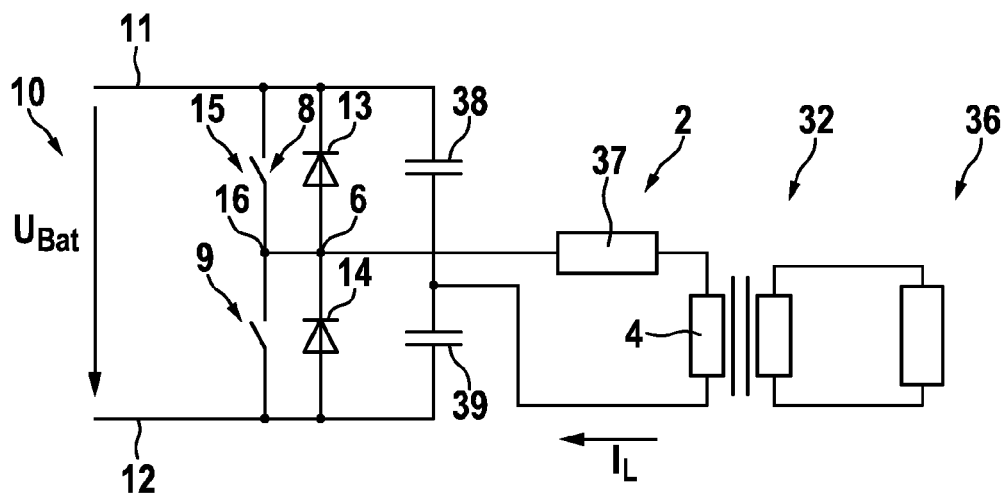
FIG. 3 shows the resonance circuit for the application of actuating a piezoelectric oscillator.

FIG. 3 shows a schematic circuit diagram, in which the use of the circuit known from FIG. 1 is depicted for actuating a piezoelectric oscillator 36. As is already known from FIG. 2, the additional resonance circuit 32 is thereby associated with the resonance circuit 2, said additional resonance circuit 32 being connected to the piezoelectric oscillator 36. Said additional resonance circuit 32 consists here too only of a coil. The control equipment 1 corresponds to the control equipment 1 already known from FIGS. 1 and 2. The configuration of the resonance circuit 2 which is used here differs however from that described with the aid of FIGS. 1 and 2. In this respect, the differences shall be addressed in the following. The resonance circuit 2 comprises, aside from the coil 4, a further coil 37 as well as two capacitors 38 and 39. The coil 4 is connected in series to the additional coil 37. The coil 37 is thereby connected to the center tap 16 of the half bridge 15, thus between the circuit elements 8 and 9. The coil 4 is connected on the side thereof facing away from the additional coil 37 between the capacitors 38 and 39, wherein the capacitor 38 is connected on the side thereof facing away from the coil 4 to the pole 11 and the capacitor 39 on the side thereof facing away from the coil 4 to the pole 12. In this way, an operation of the piezoelectric oscillator 36 is possible without sensors for determining the choke voltage $U_L$ and the choke current $I_L$.

Figure 4:
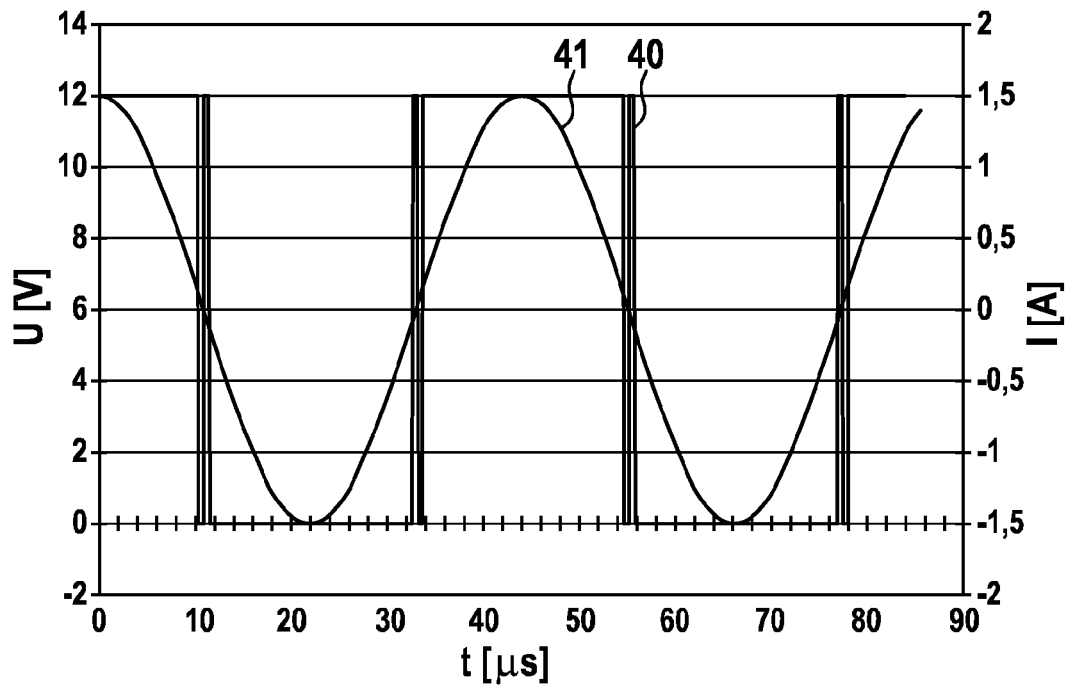
FIG. 4 shows a diagram, in which a choke current and a detected voltage are depicted versus time if the resonance circuit is operated at the resonance frequency thereof.
Figure 5:
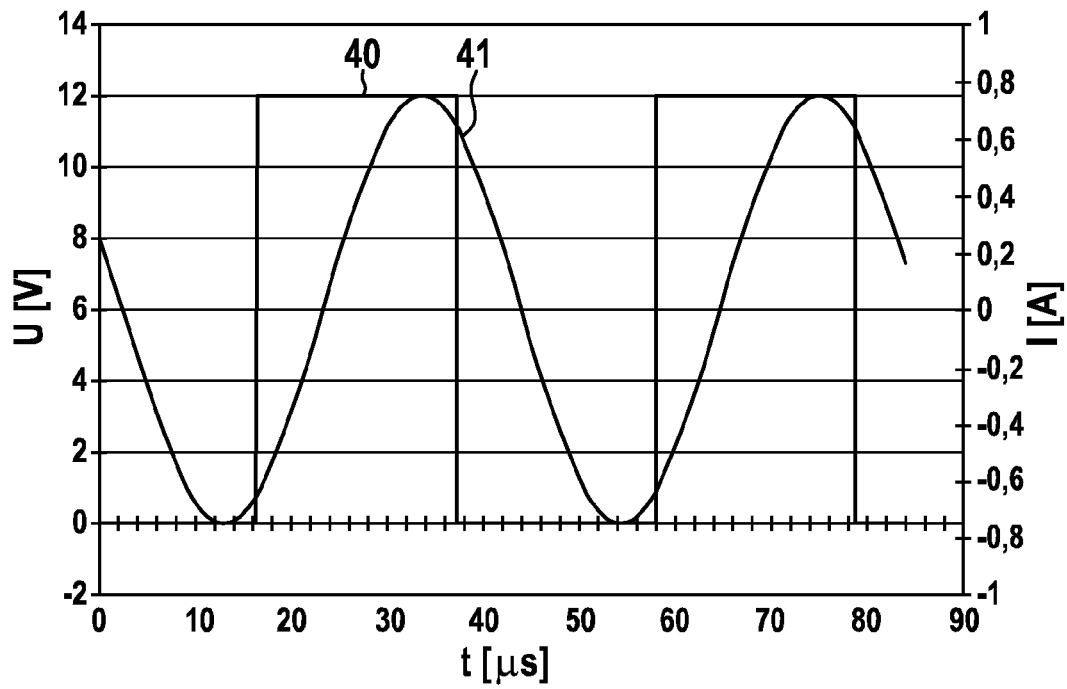
FIG. 5 shows the diagram known from FIG. 4 during an operation of the resonance circuit at an actuation frequency that is greater than the resonance frequency.
Figure 6:
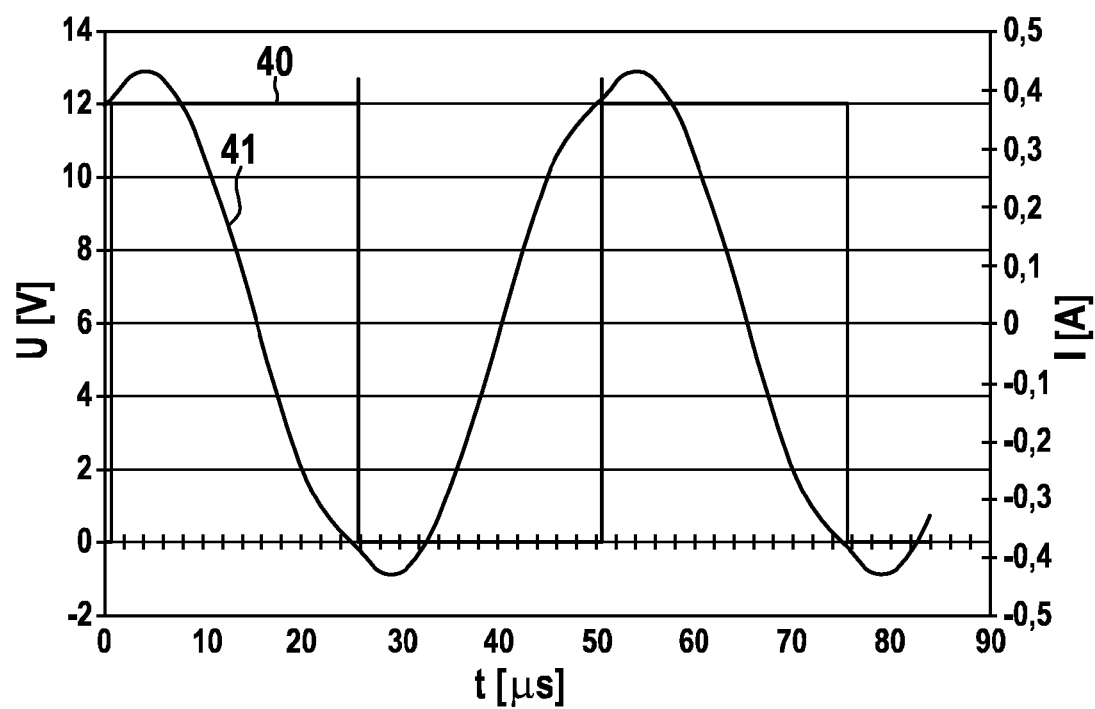
FIG. 6 shows the diagram known from FIG. 4 during an operation of the resonance circuit at an actuation frequency which is smaller than the resonance frequency.

FIGS. 4 to 6 show diagrams, in which a voltage in volts and a current in amperes are plotted versus the time in microseconds. A curve 40 corresponds thereby to the detected voltage $U_{HB}$ and a curve 41 to the choke current $I_L$. FIG. 4 shows the curve of the detected voltage $U_{HB}$ and the choke current $I_L$ if the actuation frequency substantially corresponds to the resonance frequency of the resonance circuit 2. It can be seen that the rising or sinking flank of the curve 40 lies at the inflection points. The detection of the voltage $U_{HB}$ takes place in the dead time when the flank of the curve 40 is rising. When the actuation frequency is too low, the current is in this case positive and when said actuation frequency is too high, the current is negative. This can be seen in each case in FIGS. 6 and 5. If the voltage $U_{HB}$ is detected at the center tap 16 of the half bridge 15 or at the first connection 6 at the correct point in time, the choke current $I_L$ is then equal to zero. A digital signal is thus obtained, which indicates if the actuation frequency is too high or too low. A frequency regulation by means of the counter 24 or alternatively by means of an integrator can take place using said obtained digital signal. The actuation frequency is thereby set to a new value, which lies closer to the resonance frequency than the value used up until now or in the ideal case substantially corresponds to said resonance frequency.

The invention claimed is:

1. A method for operating control equipment of a resonance circuit, wherein the control equipment comprises at least two circuit elements connected in series, each circuit element comprising a recovery diode connected in parallel, between which a connection of the resonance circuit is connected, the method comprising:
   actuating the circuit elements as a function of a detected voltage at the connection; and
   opening and closing the circuit elements for exciting the resonance circuit,
   wherein, an output of the function of the detected voltage only changes when the circuit elements are open.

2. The method according to claim 1, wherein the detected voltage is supplied to a comparator for conversion into a digital signal.

3. The method according to claim 2, wherein the digital signal is used as an input signal for a flip-flop and/or a counter.

4. The method according to claim 3, wherein a controller of the control equipment actuates the circuit elements with a specified frequency the frequency determined by the counter.

5. The method according to claim 4, wherein a clock signal is supplied by the controller to the flip-flop and/or the counter.

6. The method according to claim 5, wherein detection of the detected voltage is brought about by the clock signal supplied to the flip-flop.

7. The method according to claim 1, wherein the resonance circuit is used for contactless power transmission or for actuating a piezoelectric oscillator.

8. The control equipment of a resonance circuit, for carrying out the method according to claim 1, wherein the control equipment is configured to actuate the circuit elements as a function of the voltage detected at the connection.

9. A system for controlling a resonance circuit comprising:
   a first switch electrically connected to a second switch via a node, the node connected to a resonant circuit;
   a diode in parallel with the first switch, the diode electrically connected to the node;
   a voltage detecting circuit electrically connected to the node, the voltage detecting circuit configured to determine a length of time measured in clock cycles that a voltage at the node stays above a threshold value, the length of time being indicative of whether the first switch and the second switch are operating the resonance circuit at a resonant frequency.

10. The system according to claim 9, wherein the voltage detecting circuit includes a comparator, a flip-flop, and a counter.

11. The system according to claim 9, wherein a controller determines, based on the length of time, a switching frequency of the first switch and the second switch to operate the resonance circuit at the resonant frequency.

* * * * *